US012772843B2

(12) United States Patent
Jiang et al.

(10) Patent No.: US 12,772,843 B2
(45) Date of Patent: Oct. 20, 2026

(54) THERMALLY ENHANCED PACKAGE WITH HIGH K MOLD COMPOUND ON DIE TOP

(71) Applicant: Texas Instruments Incorporated, Dallas, TX (US)

(72) Inventors: Li Jiang, Allen, TX (US); Jie Chen, Plano, TX (US); Yutaka Suzuki, Allen, TX (US); Rajen Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 550 days.

(21) Appl. No.: 18/180,024

(22) Filed: Mar. 7, 2023

(65) Prior Publication Data

US 2024/0304517 A1 Sep. 12, 2024

(51) Int. Cl.

| | |
|---|---|
| ***H10W 40/25*** | (2026.01) |
| ***H10P 58/00*** | (2026.01) |
| ***H10W 70/63*** | (2026.01) |
| ***H10W 74/01*** | (2026.01) |
| ***H10W 74/10*** | (2026.01) |
| ***H10W 74/47*** | (2026.01) |
| ***H10W 90/00*** | (2026.01) |
| *H10W 72/00* | (2026.01) |
| *H10W 72/30* | (2026.01) |
| *H10W 74/00* | (2026.01) |

(52) U.S. Cl.

CPC ........... *H10W 40/251* (2026.01); *H10P 58/00* (2026.01); *H10W 70/635* (2026.01); *H10W 74/016* (2026.01); *H10W 74/121* (2026.01); *H10W 74/47* (2026.01); *H10W 90/00* (2026.01); *H10W 72/01321* (2026.01); *H10W 72/0198* (2026.01); *H10W 72/353* (2026.01); *H10W 74/00* (2026.01); *H10W 90/731* (2026.01); *H10W 90/794* (2026.01)

(58) Field of Classification Search

CPC ............... H01L 23/3737; H01L 21/565; H01L 23/3135; H10W 40/251; H10W 74/121; H10W 74/016; H10W 70/635

See application file for complete search history.

(56) References Cited

U.S. PATENT DOCUMENTS

| | | | | |
|---|---|---|---|---|
| 10,410,971 | B2 * | 9/2019 | Rae | H10W 42/20 |
| 2009/0194896 | A1 | 8/2009 | Chen et al. | |
| 2010/0219524 | A1 * | 9/2010 | Shen | H10W 74/117 257/E23.06 |
| 2021/0167031 | A1 * | 6/2021 | Costa | H01L 23/3128 |
| 2022/0059423 | A1 | 2/2022 | Manack et al. | |

* cited by examiner

*Primary Examiner* — Dale E Page
*Assistant Examiner* — Wilner Jean Baptiste
(74) *Attorney, Agent, or Firm* — Ronald O. Neerings; Charles F. Koch

(57) ABSTRACT

An electronic device includes: a semiconductor die having opposite first and second sides and a conductive terminal along the first side; a conductive lead electrically coupled to the conductive terminal; a package structure that forms a top side of the electronic device and encloses a portion of the semiconductor die, the package structure including a first molding compound having a first thermal conductivity; and a thermally conductive layer on at least a portion of the second side of the semiconductor die, the thermally conductive layer including a second molding compound having a second thermal conductivity that is greater than the first thermal conductivity.

11 Claims, 12 Drawing Sheets

THERMALLY ENHANCED PACKAGE WITH HIGH K MOLD COMPOUND ON DIE TOP

BACKGROUND

High power density is desirable for modern electronic devices to support industrial, automotive and other applications calling for increased device performance and smaller package sizes with good energy efficiency. Increasing the thermal conductivity of the epoxy molding compound (EMC) used in forming the device package structure can facilitate thermal performance improvements. However, changing the EMC material can affect the thermal coefficient of expansion (TCE). Mismatches between the molded package structure TCE and that of structures such as substrates and/or lead frames joined to the molded package structure can adversely affect overall device performance in terms of component level reliability, system or board level reliability, and manufacturability, such as strip warpage for flip-chip chip scale packages (FCCSP). Moreover, testing to ensure qualification with respect to manufacturability, board and component level reliability can be lengthy.

SUMMARY

In one aspect, an electronic device includes a semiconductor die with a conductive terminal along a first side thereof, a conductive lead electrically coupled to the conductive terminal of the semiconductor die, a package structure that forms a top side of the electronic device and encloses a portion of the semiconductor die. The package structure includes a first molding compound having a first thermal conductivity. The electronic device includes a thermally conductive layer on at least a portion of the second side of the semiconductor die, and the thermally conductive layer includes a second molding compound having a second thermal conductivity that is greater than the first thermal conductivity.

In another aspect, a system includes a circuit board and an electronic device. The electronic device includes a semiconductor die having opposite first and second sides and a conductive terminal along the first side, as well as a conductive lead electrically coupled to the circuit board and to the conductive terminal of the semiconductor die. The electronic device includes a package structure that forms a top side of the electronic device and encloses a portion of the semiconductor die, the package structure including a first molding compound having a first thermal conductivity. The electronic device includes a thermally conductive layer on at least a portion of the second side of the semiconductor die, the thermally conductive layer including a second molding compound having a second thermal conductivity that is greater than the first thermal conductivity.

In a further aspect, a method of fabricating an electronic device includes: forming a thermally conductive layer on at least a portion of a side of a semiconductor die; attaching the semiconductor die to a substrate or a lead frame; and forming a package structure that forms a portion of a top side of the electronic device and encloses a portion of the semiconductor die, the package structure including a molding compound having a first thermal conductivity that is less than a second thermal conductivity of the thermally conductive layer.

DETAILED DESCRIPTION

Figure 1:
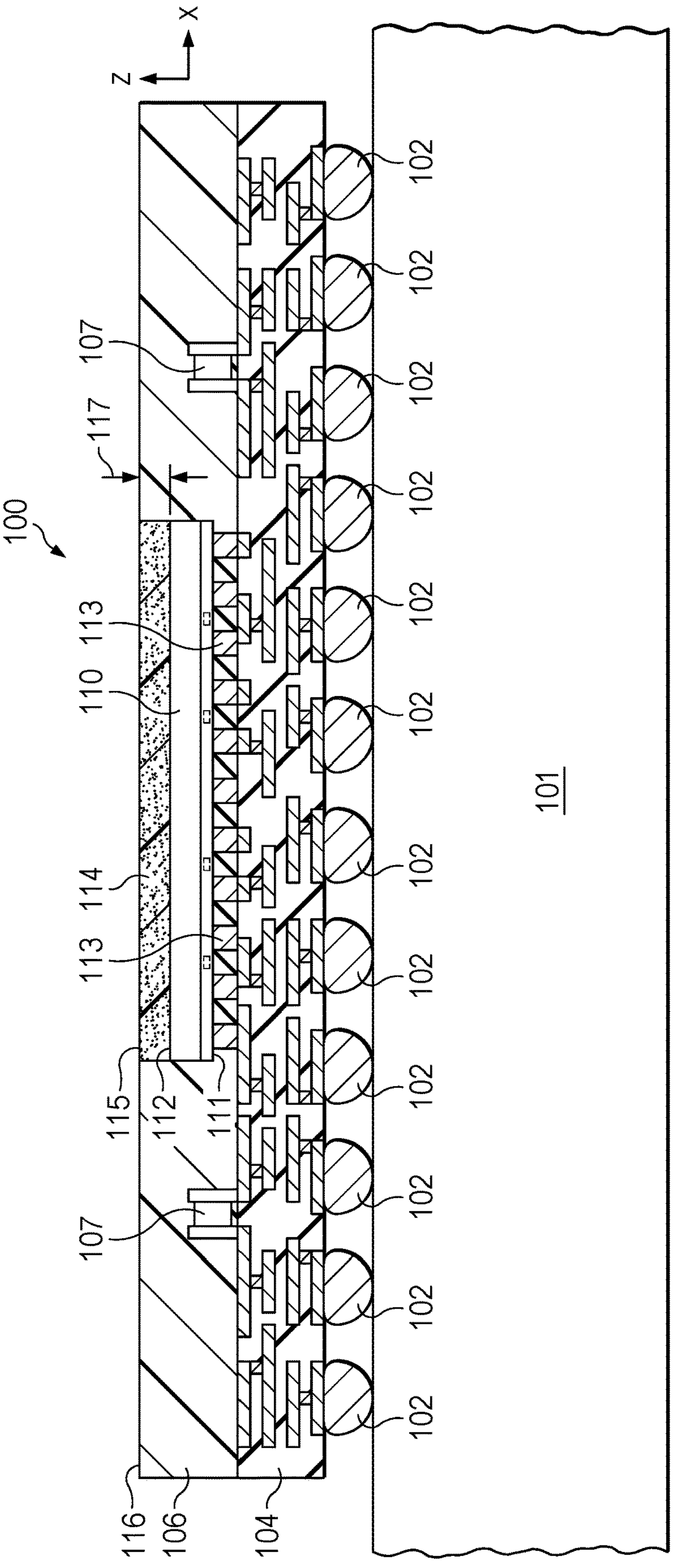
FIG. 1 is a partial sectional side elevation view of a system having a ball grid array electronic device with a high thermal conductivity molding compound between a side of a semiconductor die and an exposed top side of the electronic device.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
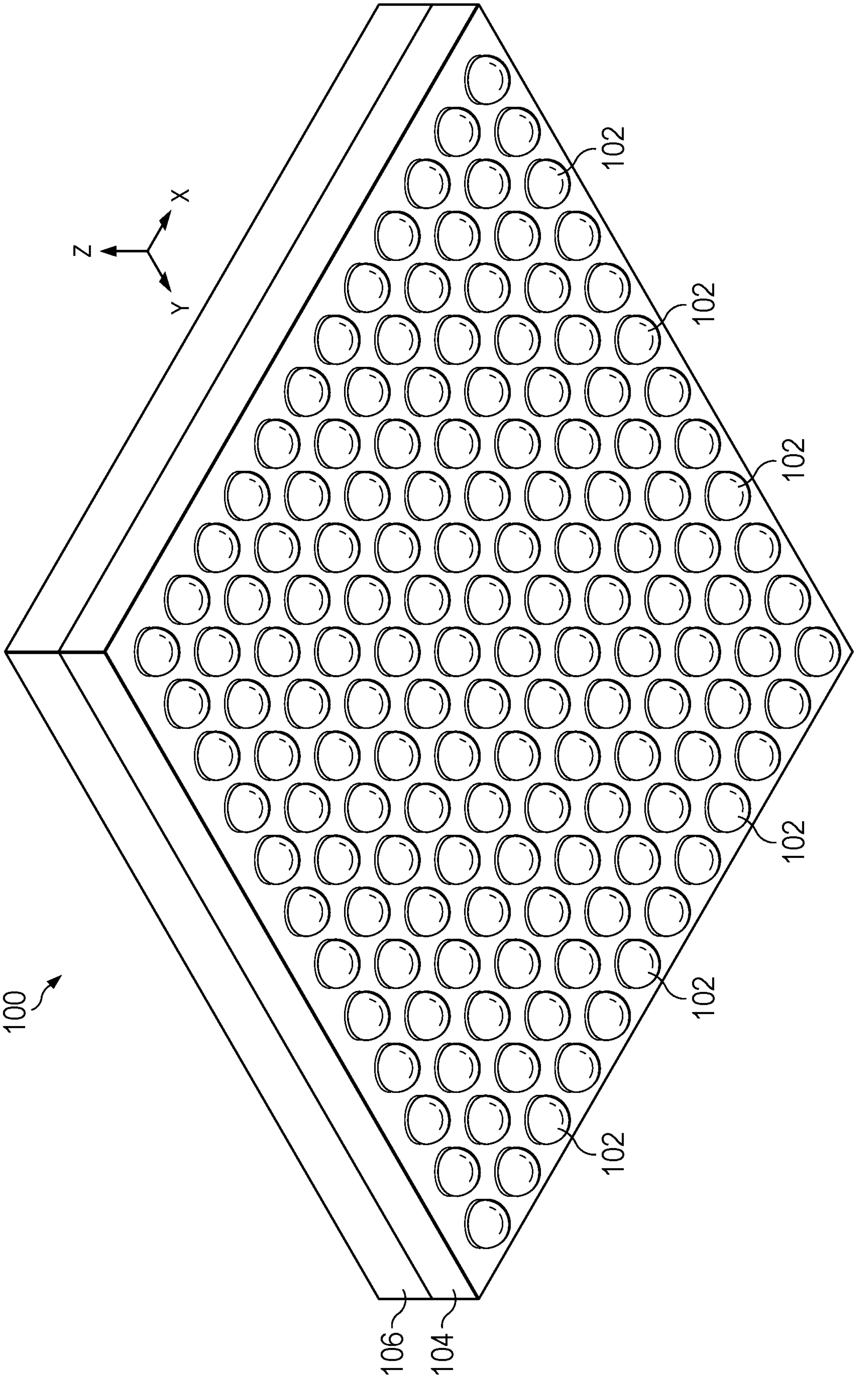
FIG. 1A is a bottom perspective view of the electronic device of FIG. 1.

FIG. 1 shows a system having a ball grid array (BGA) electronic device 100 mounted to a circuit board 101, and FIG. 1A shows a bottom perspective view of the electronic device 100. The electronic device 100 has conductive leads 102, such as solder balls soldered to conductive pads or other features of the circuit board 101. The leads 102 are connected to corresponding conductive metal features of a multilevel package substrate 104, such as a laminated substrate with conductive pads exposed along a bottom side for connection to respective ones of the leads 102, one or more levels with conductive metal routing traces and conductive metal vias between levels, and the top side conductive pads adapted for solder connection to conductive terminals of semiconductor dies and/or other electronic components. In the example of FIG. 1, the electronic device 100 also includes a molded package structure 106 that encloses passive electronic components 107 (e.g., surface mount capacitors) soldered to the top side of the substrate 104.

The electronic device 100 also includes a semiconductor die 110 with opposite first and second sides 111 and 112, respectively. The semiconductor die 110 has one or more conductive terminals 113 (e.g., conductive metal terminals, such as copper pillars, pumps, etc.) along the first side 111, and the semiconductor die 110 includes one or more electronic components (e.g., resistor, transistor, capacitor, etc.) forming a circuit electrically coupled to at least one of the conductive terminal 113 and an associated one of the conductive leads 102. The molded package structure 106 forms a top side 116 of the electronic device 100 and encloses a portion of the semiconductor die 110. The package structure 106 includes a first molding compound that has a first thermal conductivity K1.

The electronic device 100 includes a thermally conductive layer 114 on at least a portion of the top or second side 112 of the semiconductor die 110. In one example, the thermally conductive layer 114 is a high thermal conductivity epoxy molding compound. The thermally conductive layer 114 includes a second molding compound having a second thermal conductivity K2 that is greater than the first thermal conductivity K1. The thermally conductive layer 114 has a top side 115 that is exposed. In one example, the top side 115 of the thermally conductive layer 114 is approximately coplanar with the top side 116 of the electronic device 100, although not a requirement of all possible implementations. In one example, the thermally conductive layer 114 is formed by any suitable technique, such as molding, coating, deposition, etc. on the top or second side 112 of the semiconductor die 110 prior to flip chip attachment of the semiconductor die 110 to the substrate 104, and prior to molding processing that forms the molded package structure 106. In certain implementations, the top side 115 of the thermally conductive layer 114 can be slightly beneath the top side 116.

Figure 1B:
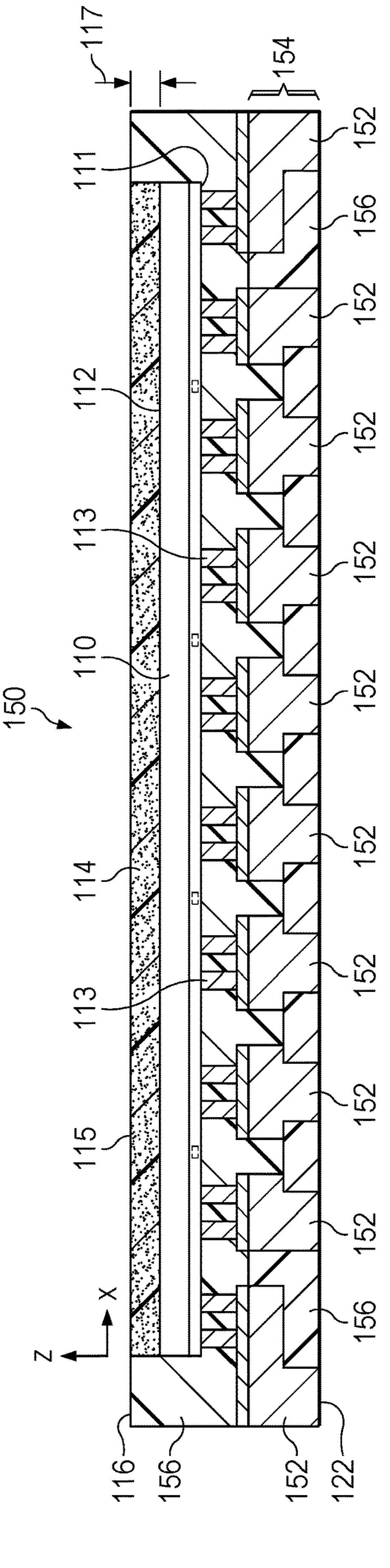
FIG. 1B is a partial sectional side elevation view of a quad flat no lead electronic device with a high thermal conductivity molding compound between a side of a semiconductor die and an exposed top side of the electronic device.
Figure 1C:
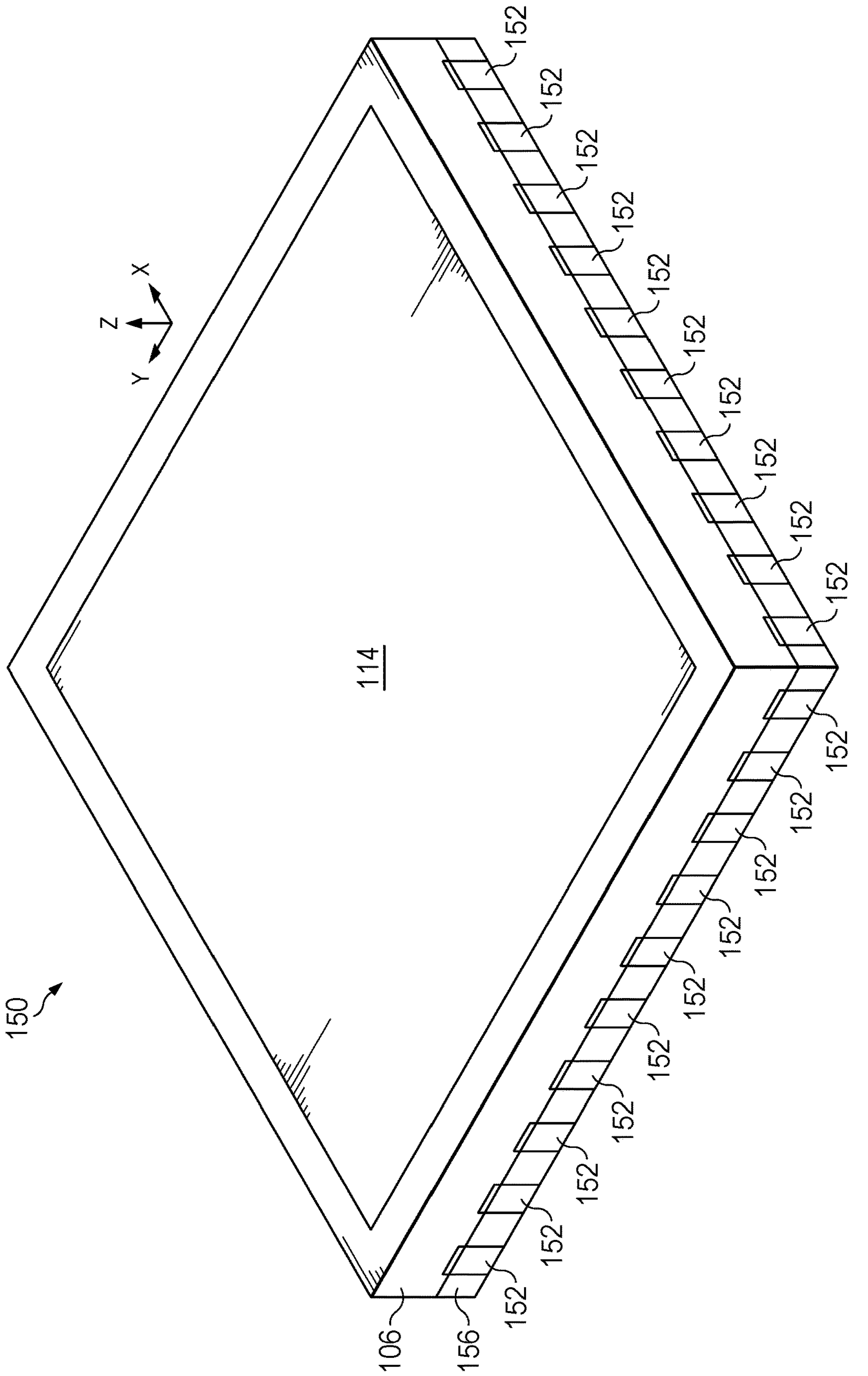
FIG. 1C is a top perspective view of the electronic device of FIG. 1B.

Referring also to FIGS. 1B and 1C, FIG. 1B shows a side view of another example electronic device 150 having a quad flat no lead (QFN) form with the thermally conductive molding compound layer 114 between the top side 112 of the semiconductor die 110 and the exposed top side of the electronic device 150, and FIG. 1C shows a top perspective view of the electronic device 150. The semiconductor die 110 in this example mounted on a lead frame during manufacturing via solder connection of the conductive terminals 113 (e.g., conductive metal terminals, such as copper pillars, pumps, etc.) along the first side 111 to corresponding conductive leads 152 of a base 154 separated during manufacturing from a starting lead frame, and the semiconductor die 110 includes one or more electronic components (e.g., resistor, transistor, capacitor, etc.) forming a circuit electrically coupled to at least one of the conductive terminal 113 and an associated one of the conductive leads 152. A molded package structure 156 forms a top side 116 of the electronic device 150 and encloses a portion of the semiconductor die 110.

The molded package structure 156 includes a first molding compound that has the first thermal conductivity K1 as discussed above in connection with the electronic device 100 of FIGS. 1 and 1A. The electronic device 150 also has a thermally conductive layer 114 with a top side 115 that is exposed. In one example, the top side 115 of the thermally conductive layer 114 is approximately coplanar with the top side 116 of the electronic device 150, although not a requirement of all possible implementations. In one example, the thermally conductive layer 114 is formed by any suitable technique, such as molding, coating, deposition, etc. on the top or second side 112 of the semiconductor die 110 prior to flip chip attachment of the semiconductor die 110 to the leads 152 of the starting lead frame, and prior to molding processing that forms the molded package structure 156. In certain implementations, the top side 115 of the thermally conductive layer 114 can be slightly beneath the top side 116. In one example, the molded package structure 156 is formed during molding to extend and fill gaps between the conductive leads 152 as well as under the bottom side 111 and lateral sides of the semiconductor die 110 as shown in FIG. 1B. This example construction provides the QFN packaged electronic device 150 with a high I/O density.

In the electronic devices 100 and 150, the thermally conductive layer 114 provides a heat dissipation path between the semiconductor die 110 and the exterior of the electronic device 100, 150 in order to facilitate good thermal performance. Moreover, the thermally conductive layer 114 does not interface with the base 154, the substrate 104 or the other passive components 107 and structures of the electronic device 100, 150, and therefore does not present a design modification that requires extensive testing with respect to board level reliability, system level reliability, and/or other manufacturability qualifications. In this manner, the thermally conductive layer 114 provides a solution to facilitate enhanced heat dissipation with respect to circuitry of the semiconductor die 110 and other components of the electronic device 100, 150 (e.g., the capacitors 107 in FIG. 1) while facilitating introduction into a manufacturing process without changing the CTE matching between the molded package structure 106, 156 and other structures of the electronic device 100, 150. Moreover, these benefits can be supplemented by use of a heat sink or other heat spreader attached to the thermally conductive layer 114, for example, as illustrated and described below in connection with FIGS. 7 and 8.

In one example, the second thermal conductivity K2 is greater than twice the first thermal conductivity K1 (e.g., K2 >2K1). In this or other examples, the second thermal conductivity K2 is approximately 2 W/mK (watts per thousandth of a degree Kelvin) or more and approximately 10 W/mK or less. In the above or other examples, the second thermal conductivity K2 is approximately 3 W/mK or more and approximately 9 W/mK or less. In the above or other examples, the first thermal conductivity K1 is approximately 1 W/mK or less. In the above or other examples, the molding compound of the package structure 106, 156 is a first epoxy molding compound having the first thermal conductivity K1. In the above or other examples, the thermally conductive layer 114 has a thickness 117 of approximately 50 μm or more and approximately 200 μm or less.

Referring also to FIGS. 2-8, FIG. 2 shows a method 200 of fabricating an electronic device and FIGS. 3-8 show the example electronic device 100 undergoing fabrication processing according to the method 200. The method 200 in one example includes wafer processing at 202 to form electronic circuit components, such as transistors, diodes, resistors, capacitors, etc. on and/or in a semiconductor wafer. At 204, the method 200 includes forming a metallization structure on a front side of the wafer, for example, including one or more levels or layers of dielectric material with conductive contacts, traces, and via structures that form an electrical interconnections between electronic components of the wafer as well as routing to the conductive terminals 113 for external connections to circuitry of subsequently separated semiconductor dies. In one example, the method 200 also includes wafer backside grinding at 205, for example, to set a final wafer and semiconductor die thickness to accommodate packaging requirements. In another implementation, the wafer backside grinding at 205 can be omitted.

Figure 2:
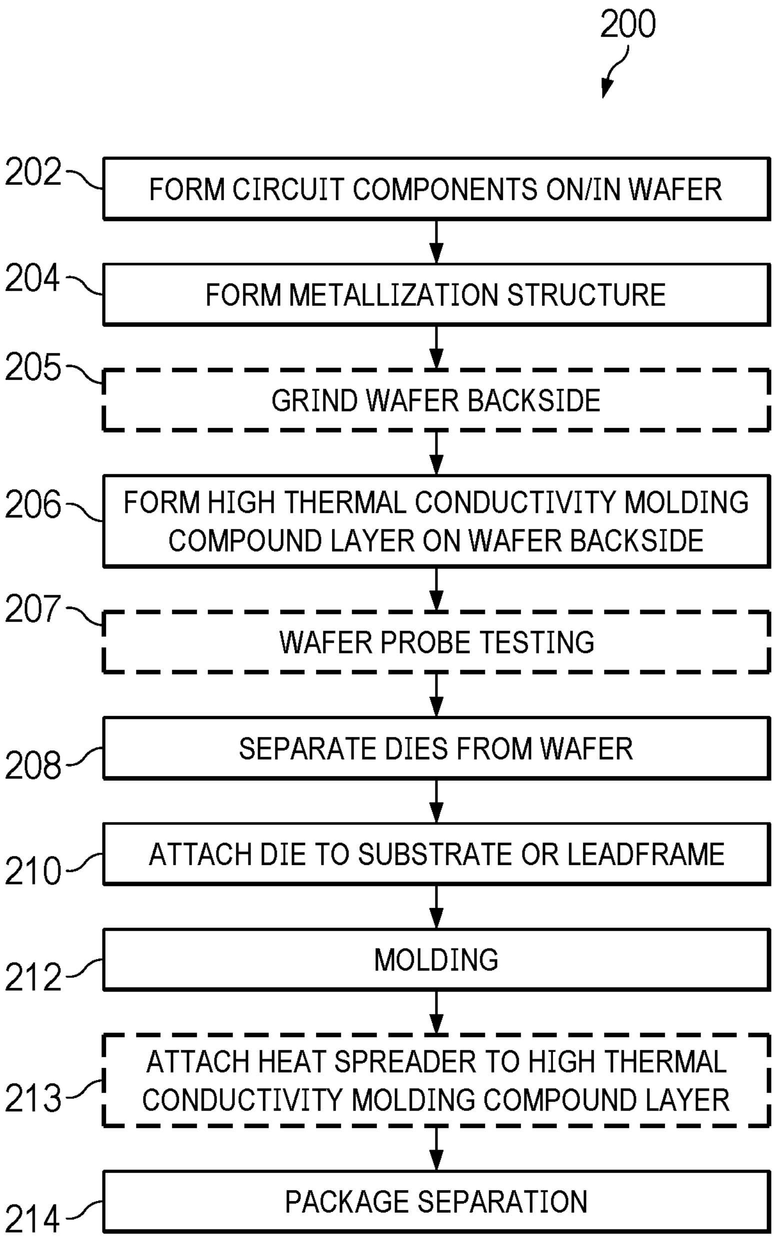
FIG. 2 is a flow diagram of a method of fabricating an electronic device.
Figure 3:
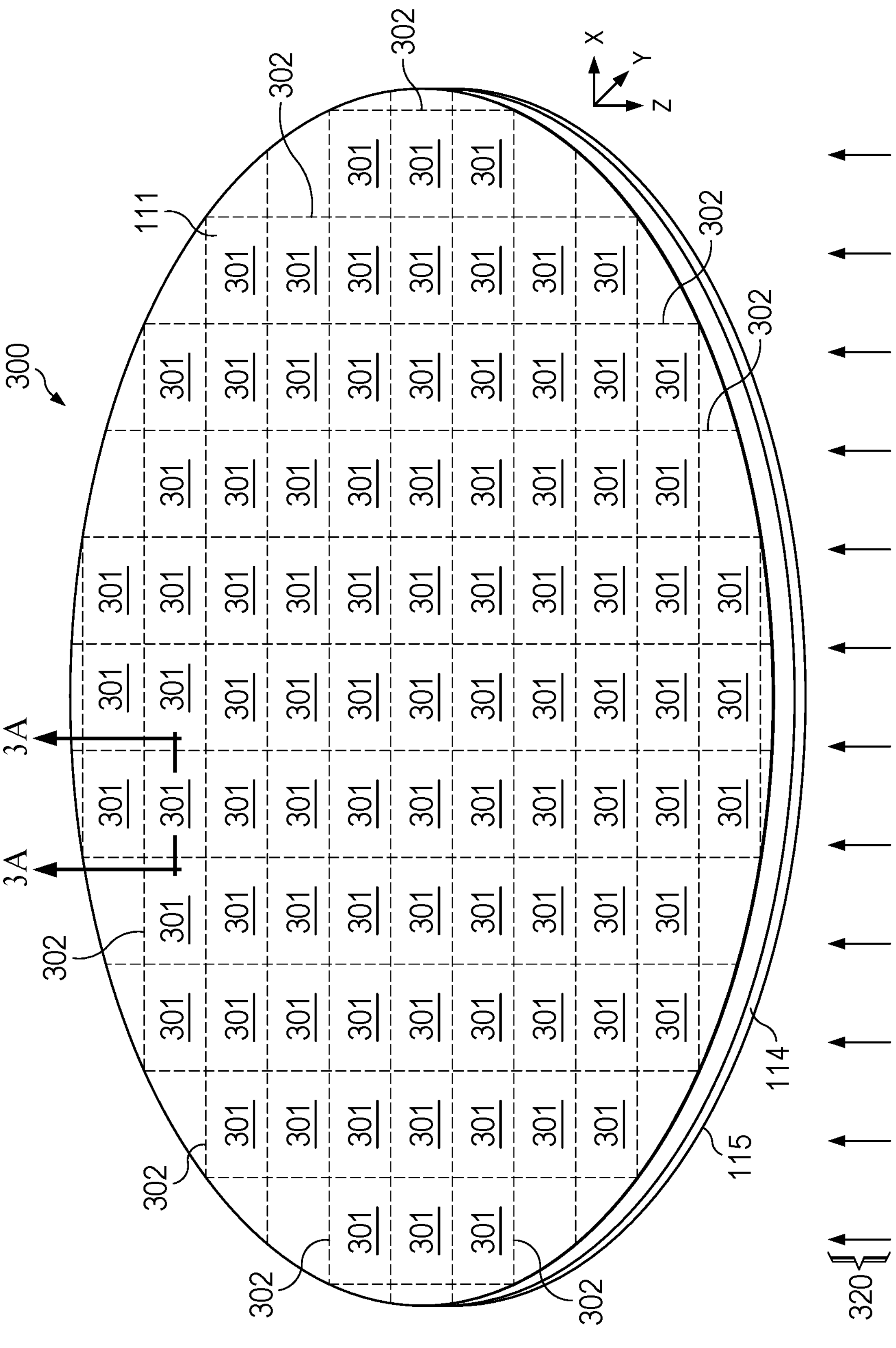
FIG. 3 is a top perspective view of a semiconductor wafer undergoing a process to form a high thermal conductivity molding compound on the wafer back side.
Figure 3A:
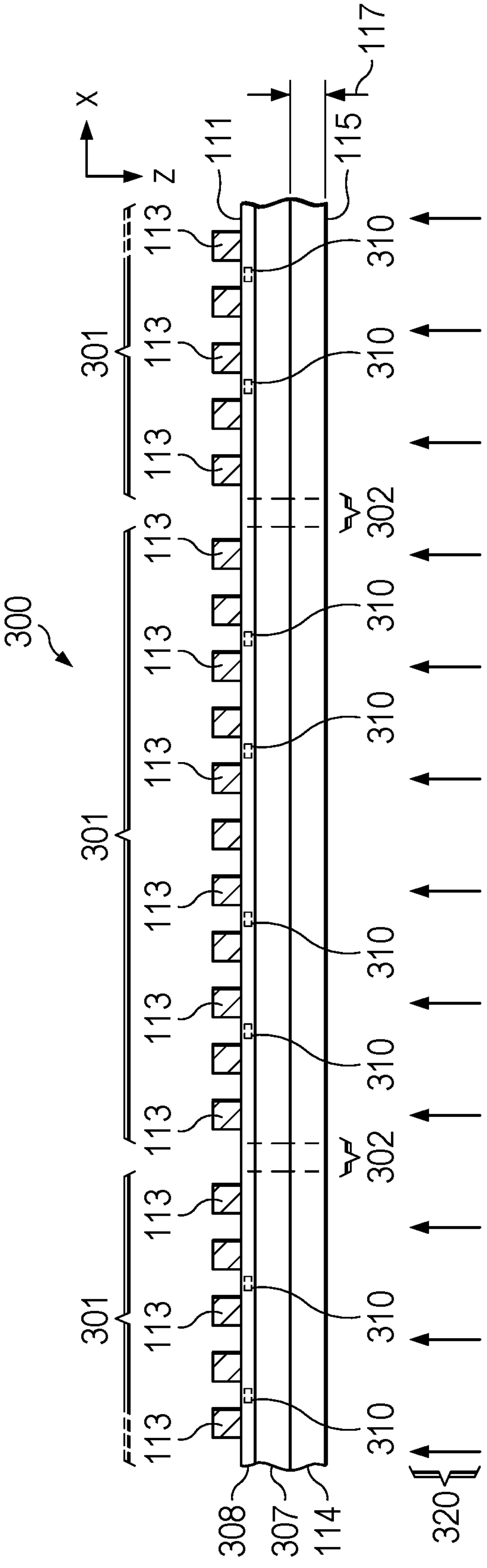
FIG. 3A is a partial sectional side elevation view of the semiconductor wafer of FIG. 3 taken along line 3A-3A of FIG. 3.

At 206 in FIG. 2, the method 200 includes forming the thermally conductive layer 114 on at least a portion of the top side of the wafer. FIGS. 3 and 3A illustrate an example semiconductor wafer 300 undergoing a layer formation process 320 to form a high thermal conductivity molding compound on the wafer back side, where FIG. 3A is a partial sectional side view taken along line 3A-3A of FIG. 3. As seen in FIGS. 3 and 3A, the semiconductor wafer 300 is shown in an example position or orientation in a three-dimensional space with a first direction X, a perpendicular (orthogonal) second direction Y, and a third direction Z that is perpendicular (orthogonal) to the respective first and second directions X and Y, and structures or features along any two of these directions are orthogonal to one another. As shown in FIG. 3, the semiconductor wafer 300 includes an array of unit areas 301 arranged in rows along the first direction X and columns along the second direction Y. The unit areas 301 are subsequently separated from the wafer 300 to form semiconductor dies. The semiconductor wafer 300 has respective scribe streets 302 between adjacent unit areas 301. As best shown in FIG. 3, the semiconductor wafer 300 with the thermally conductive layer 114 has opposite first and second (e.g., bottom and top) sides 111 and 115, respectively, which are spaced apart from one another along the third direction Z. The first and second sides 111 and 115 extend in respective first and second planes of the first and second directions X and Y. The process 320 in one example forms the thermally conductive layer 114 across substantially all the back side of the wafer 300 as shown in FIG. 3. The high thermal conductivity molding compound layer 114 has a thickness 117 along the third direction Z, for example, approximately 10 μm or more and approximately 1000 μm or less, such as approximately 50 μm or more and approximately 200 μm or less. In one example, the process 320 forms the thermally conductive layer 114 on at least a portion of the back or second side 112 of the wafer 300. In this or other examples, the process 320 is performed prior to die simulation to form the thermally conductive layer 114 on a side of a semiconductor wafer 300 before the semiconductor die 110 is separated 208 from the semiconductor wafer 300.

As shown in FIG. 3A, the wafer 300 has a base region 307 and an upper region 308 that extends along the first side 111. The base region in one example is or includes silicon, gallium nitride (GaN) or other semiconductor material. In one implementation, the base region 307 is or includes a silicon on insulator (SOI) structure. The upper region 308 in one example includes a semiconductor material on and/or in which one or more electrical components 310 are formed as well as an overlying single or multilevel metallization structure with one or more dielectric layers (e.g., SiO2) and patterned conductive metal signal routing structures (e.g., copper, aluminum, etc.) formed at 204 in FIG. 2. The wafer 300 also has conductive terminals 113 that are exposed for wafer probe testing along the top side 111, for example, to test the electrical components 310 and circuits of the respective unit areas 301. The terminals 113 are electrically coupled through the metallization level or levels to provide probable electrical connections to terminals of associated ones of the electrical components 310 for connection to circuitry of a semiconductor die 110 (e.g., FIGS. 1 and 1B above) that are separated from the wafer during electronic device packaging. In addition, the terminals 113 allow electrical connection to a substrate 104 (FIG. 1) and/or conductive leads of a starting lead frame structure (FIG. 1B), for example, by flip chip soldering of the terminals 113 to respective contacts of a laminated substrate, to contacts of a lead frame, and/or by bond wire connections (not shown). In one example, the thermally conductive layer 114 is an epoxy molding compound formed by a molding process 320 at 206 in FIG. 2. In another example, the thermally conductive layer 114 is formed by a coating process 320 at 206 in FIG. 2. In another example, the thermally conductive layer 114 is formed by a deposition process at 206 in FIG. 2.

Figure 4:
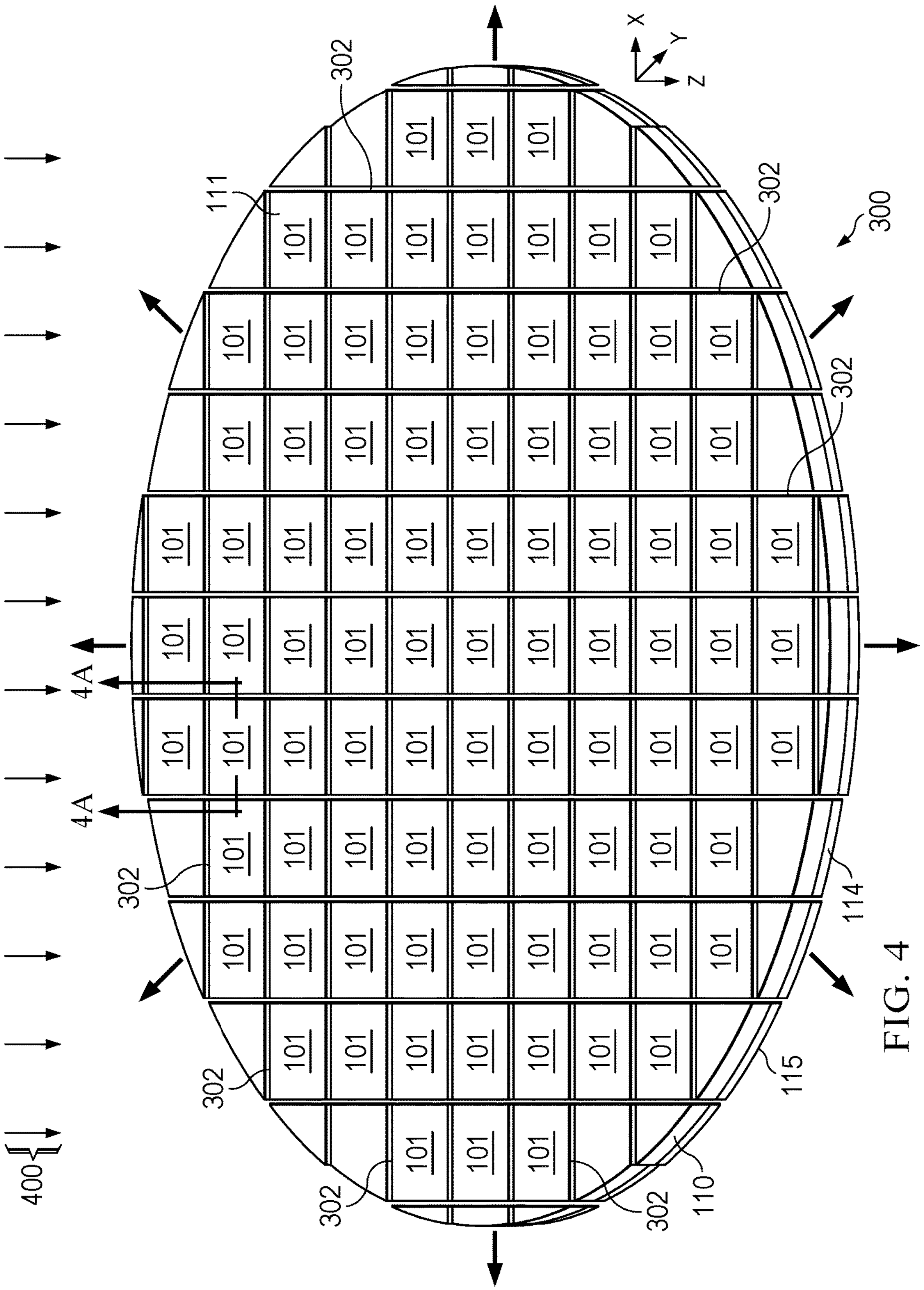
FIG. 4 is a top perspective view of the semiconductor wafer undergoing a die singulation process to separate individual semiconductor dies therefrom.
Figure 4A:
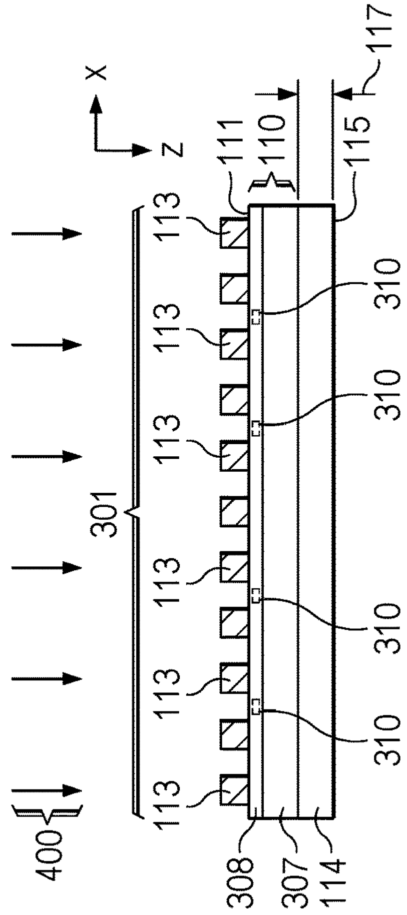
FIG. 4A is a partial sectional side elevation view of a singulated semiconductor die separated from the of FIG. 3 taken along line 4A-4A of FIG. 4.

At 208 in FIG. 2, the method 200 includes separating individual semiconductor dies 110 from the wafer 300. FIGS. 4 and 4A a show one example, in which a die separation process 400 is performed that separates the semiconductor dies 110 from the starting wafer 300, leaving the thermally conductive layer 114 along the bottom sides of the separated semiconductor dies 110. In one implementation, the back side of the semiconductor wafer 300 is subjected to a laser or saw cutting process to form an initial cuts along the scribe streets 302 between adjacent ones of the unit areas 301. The wafer 300 is mounted on an expandable tape or other carrier structure (not shown), and the separation process 400 includes pulling the edges of the carrier structure radially outward as shown by the arrows in FIG. 4. The separation process 400 yields individual semiconductor dies 110, one of which is shown in FIG. 4A.

Figure 5:
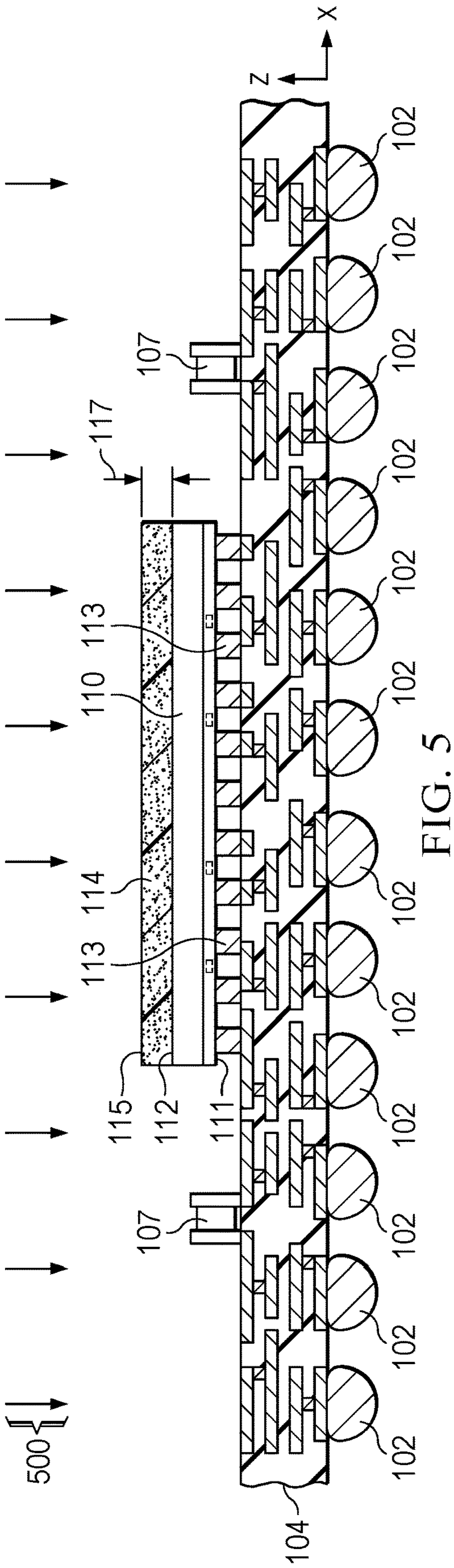
FIG. 5 is a partial sectional side elevation view of a laminated multilevel package substrate panel array undergoing a flip chip die attach process to solder terminals of the semiconductor die of FIG. 4A to a unit area of the panel array.

The method 200 continues at 210 with die attach processing to attach individual semiconductor dies 110 to a substrate or lead frame. FIG. 5 shows one example, in which a flip-chip die attach process 500 is performed that attaches the semiconductor die 110 to the laminated substrate 104 described above in connection with FIGS. 1 and 1A. The die attach process 500 in one example is performed to attach individual semiconductor dies 110 to respective unit areas of a substrate panel having rows and columns of such unit areas, and includes dipping or other application of solder to the bottoms of the conductive terminals 113 of the individual semiconductor dies 110, automated pick and place positioning of the respective semiconductor dies 110 with the conductive terminals 113 aligned with corresponding conductive pads or features on the top side of the substrate 104. The process 500 in one example also includes automated pick and place positioning of any other components, such as the passive capacitor components 107 on associated conductive features on the top side of the substrate 104. The process 500 in this example also includes a thermal heating process to reflow the solder and provide solder connections of the conductive die terminals 113 and the terminals of any included passive components 107 in each unit area of the starting substrate array.

Figure 6:
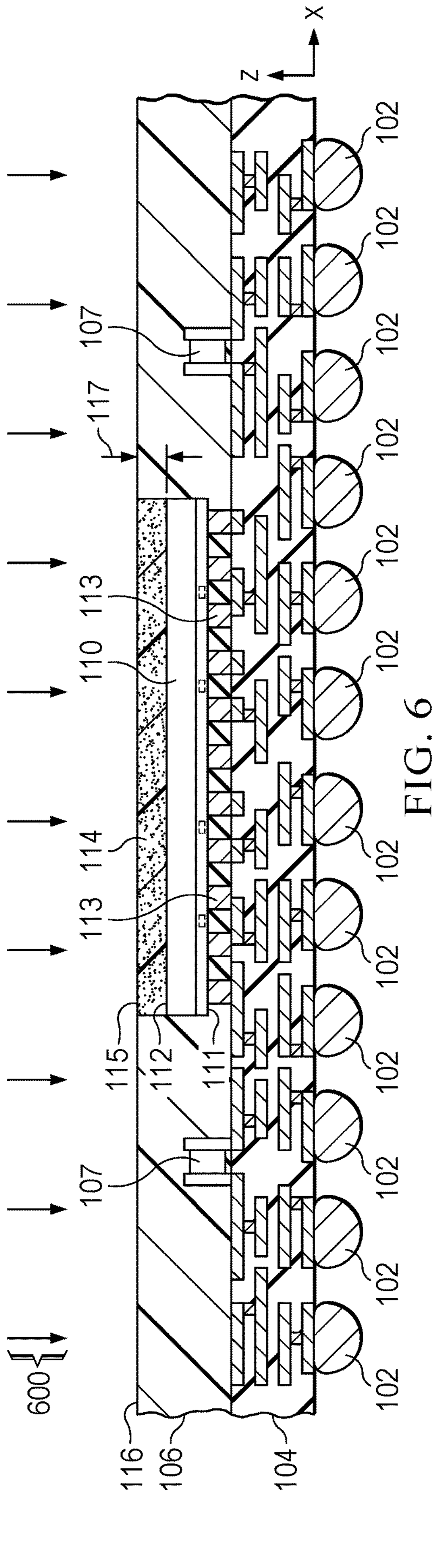
FIG. 6 is a partial sectional side elevation view of the multilevel package substrate panel array undergoing a molding process to form a package structure with a lower thermal conductivity molding compound.

At 212 in FIG. 2, the method 200 includes forming the package structure 106 by molding processing. FIG. 6 shows one example, in which a molding process 600 is performed that forms the package structure 106 that forms includes an epoxy molding compound having a first thermal conductivity K1 that is less than a second thermal conductivity K2 of the thermally conductive layer 114. The molding process 600 forms a package structure 106 that includes a portion of a top side 116 of the prospective electronic device 100 and encloses a portion of the semiconductor die 110. In one implementation, the molding process 600 is performed using a mold with cavities disposed along columns of the substrate panel array. In another implementation, the mold can have a single cavity that extends across all unit areas of the substrate panel array. In a further implementation, the mold has individual cavities for each unit area of the substrate panel array.

Figure 7:
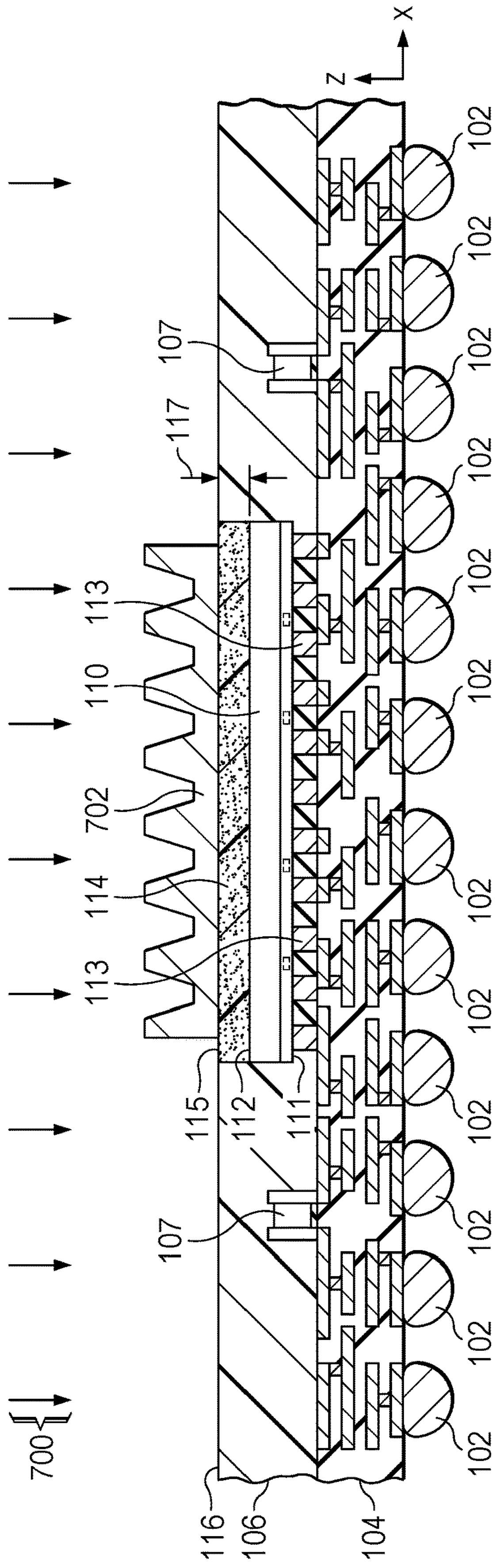
FIG. 7 is a partial sectional side elevation view of the multilevel package substrate panel array undergoing an optional heat spreader attachment process to attach a heat spreader to the high thermal conductivity molding compound on the wafer back side.

In one example, the method 200 of FIG. 2 also includes attachment of a heatsink or other type or form of heat spreader to at least a portion of the top side 115 of the thermally conductive layer 114. FIG. 7 shows one example, in which a heat spreader attachment process 700 is performed that attaches a heat spreader 702 to a portion of the top side 115 of the thermally conductive layer 114. In another example, the heat spreader attachment processing at 213 in FIG. 2 is omitted.

Figure 8:
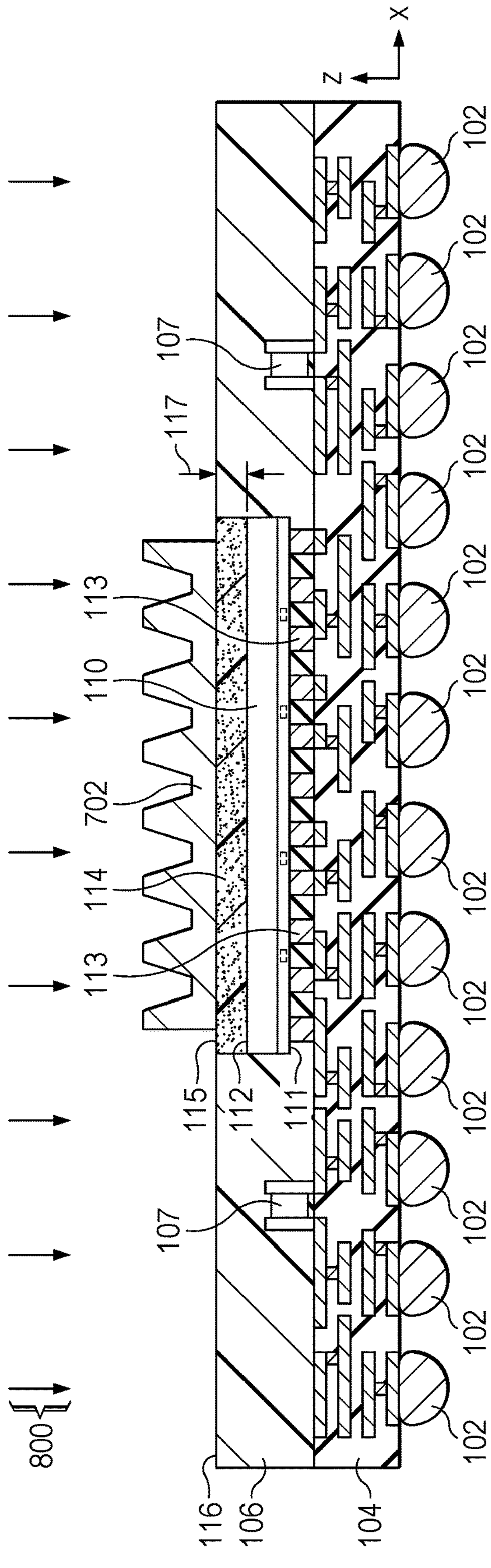
FIG. 8 is a partial sectional side elevation view of the multilevel package substrate panel array undergoing a package separation process to separate individual packaged electronic devices from the panel array.

The method 200 also includes package separation at 214 and FIG. 2. FIG. 8 shows one example, in which a package separation process 800 is performed, for example, using saws or lasers or other cutting tools (not shown) to separate individual packaged electronic devices from the starting substrate panel array. In another possible implementation, the thermally conductive layer 114 is formed on all or a portion of the top side of the semiconductor die 110 after die separation at 208. In one possible example, the thermally conductive layer 114 is formed along the top side of the semiconductor die 110 after die attach processing at 210, for example, using a molding process, a coating process, a deposition process, etc. The illustrated example provides a cost-effective approach with the thermally conductive layer 114 formed at the wafer level prior to die separation at 208.

Described examples facilitate improving thermal performance of packaged electronic devices by including a thermally conductive layer 114 along at least a portion of a side of a semiconductor die 110, without changing any previously engineered CTE matching between the remainder of the molded package structure 106 and other structures of the finished electronic device 100, 150. In this manner, localize thermal conductivity improvements are enabled without extensive engineering development time, qualification testing, etc., while facilitating desired overall device performance in terms of component level reliability, system or board level reliability such as thermo-mechanical reliability examined by temperature cycling testing, and manufacturability, such as mitigating strip warpage for flip-chip chip scale packages (FCCSP). The described examples also find utility in designs that cannot be implemented with exposed die structures, for example certain FCCSP subject to design rules with respect to low mold compound volume percentage in designs having large semiconductor dies 110 and associated large die area to package ratios. Rather than requiring design and development of an entirely new thermally conductive package structure to support these applications, the described examples provide a solution that allows large semiconductor dies and includes capacitors or other passive components on a substrate or lead frame structure, with selective use and location of the thermally conductive layer 114 to enhance thermal performance of the finished packaged electronic device 100 while mitigating adverse effects on one or more of board level reliability, component level reliability (e.g., failures of die to substrate cracked solder interconnection and/or metal layer damage inside die), system level reliability and/or other manufacturability considerations, and while avoiding potentially length the requalification testing and certification. These benefits, moreover, can be used alone or in combination with the addition of heatsinks, heat slugs, or other heat spreader structures on top of the packaged electronic device for further thermal performance advantages.

Thermal and mechanical simulation results indicate thermal enhancement in the described examples compared with a single standard package structure 106 extending above the semiconductor die 110, and comparable thermal performance compared to using a single high thermal conductivity mold compound for the entire device with lower reliability risks and reduced development time in component level reliability and manufacturability. One example was simulated for a 196 pin ACP FCCSP package with 12×12 mm package size, 8.6×9.5×0.2 mm die size, and a 6 layer laminated substrate 104, with the following parameters kept constant: ambient temperature of 25 degrees C., die power of 11 W, in a system installation using a 4 layer printed circuit board and a 19×19×20 mm heat spreader, 0.005" thick TIM2 @4 W/mK for variations in the molding compound materials of the package structure 106 (POR mold with a thermal conductivity of 0.95 W/mK) and the thermally conductive layer 114 in a mixed epoxy molding compound structure with the thermally conductive layer 114 having thermal conductivities of approximately 3 W/mK and approximately 8.7 W/mK extending over the top side of the semiconductor die 110 and the package structure 106 having a thermal conductivity of 0.95 W/mK. These results show approximately 3-4° C. reduction in die junction temperature for the examples using the thermally conductive layer 114 compared to the use of a normal package with only the lower thermal conductivity package structure 106. The following Table 1 shows the simulated junction to case thermal resistance (T_die-T_case)/Total Power and junction to air thermal resistance (T_die-T_air)/Total Power.

TABLE 1

| | Normal EMC Package 0.95 W/mK | Mixed EMC Package 1 3 W/mK | Mixed EMC Package 2 8.7 W/mK |
|---|---|---|---|
| Thermal Resistance Junction to Case (° C./W) | 0.85 | 0.34 | 0.13 |
| Thermal Resistance Junction to air (° C./W) | 9.54 | 9.26 | 9.15 |

The following Table 2 shows board level mechanical simulations with respect to board level reliability for the simulated 196 pin ACP FCCSP package with 12×12 mm package size, 8.6×9.5×0.2 mm die size, and a 6 layer laminated substrate 104, with the following parameters kept constant: ambient temperature of 25 degrees C., die power of 11 W, in a system installation using a 4 layer printed circuit board and a 19×19×20 mm heat spreader, 0.005" thick TIM2 @ 4 W/mK for variations in the molding compound materials of the package structure 106 (POR mold with a thermal conductivity of 0.95 W/mK) and the thermally conductive layer 114 in a mixed epoxy molding compound structure with the thermally conductive layer 114 having thermal conductivity of approximately 3 W/mK extending over the top side of the semiconductor die 110 and the package structure 106 having a thermal conductivity of 0.95 W/mK. The mechanical simulation helps evaluate ball crack risk under board level reliability thermal cycle loading (−40/125C) for the proposed and standard packages, where the described examples with the thermally conductive layer 114 having thermal conductivity of approximately 3 W/mK extending over the top side of the semiconductor die 110 and the package structure 106 having a thermal conductivity of 0.95 W/mK shows better performance than normal standard package having only the package structure 106

TABLE 2

| | CTE (ppm/C.) | Modulus (GPa) |
|---|---|---|
| HighK EMC | 13.1 | 28.8 |
| Standard Mold | 10.0 | 21.7 |
| Effective Substrate | 15.2 | 24.5 |
| PCB | 16.3 | 22.4 |

The described examples have similar or better reliability performance and enhanced thermal performance and minimal cost impact as adding only a single process at 206 in FIG. 2 after wafer fabrication and/or after assembly. The described examples can also be used in connection with other packages with flip-chip die and with mold compound on the die top, such as flip-chip QFN, flip-chip BGA/CSP with molding compound underfill, and can be applied to any mold compound materials. The described solutions can reduce thermal resistance of the die top-side dissipation channel and keep thermal resistance of the bottom-side channel help to balance the dissipation capabilities from these two thermal channels.

Modifications are possible in the described examples, and other implementations are possible, within the scope of the claims.

What is claimed is:

1. An electronic device, comprising:

a semiconductor die having opposite first and second sides and a conductive terminal along the first side;

a conductive lead electrically coupled to the conductive terminal of the semiconductor die;

a package structure that forms a top side of the electronic device and encloses a portion of the semiconductor die, the package structure including a first molding compound having a first thermal conductivity; and a thermally conductive layer on at least a portion of the second side of the semiconductor die, the thermally conductive layer including a second molding compound having a second thermal conductivity that is greater than the first thermal conductivity.

2. The electronic device of claim 1, wherein the second thermal conductivity is greater than twice the first thermal conductivity.

3. The electronic device of claim 2, wherein the second thermal conductivity is approximately 2 W/mK or more and approximately 10 W/mK or less.

4. The electronic device of claim 3, wherein the second thermal conductivity is approximately 3 W/mK or more and approximately 9 W/mK or less.

5. The electronic device of claim 3, wherein the first thermal conductivity is approximately 1 W/mK or less.

6. The electronic device of claim 2, further comprising a heat spreader attached to the thermally conductive layer.

7. The electronic device of claim 1, wherein the second thermal conductivity is approximately 2 W/mK or more and approximately 10 W/mK or less.

8. The electronic device of claim 7, wherein the second thermal conductivity is approximately 3 W/mK or more and approximately 9 W/mK or less.

9. The electronic device of claim 1, further comprising a heat spreader attached to the thermally conductive layer.

10. The electronic device of claim 1, wherein:

the molding compound of the package structure is a first epoxy molding compound having the first thermal conductivity; and the second thermal conductivity is greater than twice the first thermal conductivity.

11. The electronic device of claim 1, wherein the thermally conductive layer has a thickness of approximately 50 μm or more and approximately 200 μm or less.

* * * * *